United States Patent
Alley

(10) Patent No.: US 9,148,239 B2
(45) Date of Patent: Sep. 29, 2015

(54) SYSTEMS AND METHODS FOR PROGRAMMATICALLY FILTERING FREQUENCY SIGNALS

(75) Inventor: Daniel Milton Alley, Roanoke, VA (US)

(73) Assignee: General Electric Company, Schenectady, NY (US)

(*) Notice: Subject to any disclaimer, the term of this patent is extended or adjusted under 35 U.S.C. 154(b) by 380 days.

(21) Appl. No.: 13/557,957

(22) Filed: Jul. 25, 2012

(65) Prior Publication Data

US 2014/0029632 A1 Jan. 30, 2014

(51) Int. Cl.
*H04J 1/00* (2006.01)
*H04J 3/04* (2006.01)
*H03M 3/00* (2006.01)
*H04L 5/06* (2006.01)

(52) U.S. Cl.
CPC ............... *H04J 1/00* (2013.01); *H03M 3/462* (2013.01); *H04J 3/04* (2013.01); *H04L 5/06* (2013.01)

(58) Field of Classification Search
CPC ........................................................ H04L 5/06
USPC .......................................................... 370/480
See application file for complete search history.

(56) References Cited

U.S. PATENT DOCUMENTS

| | | | | |
|---|---|---|---|---|
| 5,627,536 A | * | 5/1997 | Ramirez | ............ 341/141 |
| 6,356,872 B1 | * | 3/2002 | Leung et al. | ............ 704/503 |
| 6,593,865 B2 | | 7/2003 | Nestler et al. | |
| 6,611,220 B1 | | 8/2003 | Snyder | |
| 6,686,860 B2 | | 2/2004 | Gulati et al. | |
| 6,864,822 B2 | | 3/2005 | Gulati et al. | |
| 7,002,501 B2 | | 2/2006 | Gulati et al. | |
| 7,193,544 B1 | * | 3/2007 | Fitelson et al. | ............ 341/143 |
| 7,230,557 B1 | * | 6/2007 | Burk et al. | ............ 341/155 |
| 7,760,118 B2 | | 7/2010 | Rzehak | |
| 2006/0291428 A1 | * | 12/2006 | Filipovic | ............ 370/335 |
| 2007/0115161 A1 | * | 5/2007 | May et al. | ............ 341/155 |
| 2008/0186218 A1 | * | 8/2008 | Ohkuri et al. | ............ 341/143 |

* cited by examiner

*Primary Examiner* — Christopher R Crompton
(74) *Attorney, Agent, or Firm* — Sutherland Asbill & Brennan LLP

(57) ABSTRACT

Certain embodiments herein describe filtering signals or channels using a programmable bandwidth filter. Each channel may be filtered according to a different bandwidth such that noise may be removed from each channel without the need to increase the complexity of an anti-aliasing filter, for example. In one embodiment, the programmable filter may be a decimation filter that may be coupled to a delta sigma modulator, which may sample an analog channel according to a programmable sampling rate to generate a digital representation of the analog channel. In one embodiment, multiple analog channels may be multiplexed and subsequently sampled and filtered by the delta sigma modulator and decimation filter, respectively. According to various embodiments, the above processing may be performed by an application specific integrated circuit (ASIC), a microcontroller, or a computing device including one or more software programs and/or modules.

12 Claims, 5 Drawing Sheets

SYSTEMS AND METHODS FOR PROGRAMMATICALLY FILTERING FREQUENCY SIGNALS

TECHNICAL FIELD

Embodiments herein relate generally to signal processing and, more particularly, to filtering signals using a programmable bandwidth filter.

BACKGROUND OF THE INVENTION

Various types of filters may be used to remove noise or other unwanted data from a signal or channel. For example, anti-aliasing filters may be used to filter a channel before it is received by various devices, such as analog-to-digital converters (ADCs). Such devices may include additional components, such as a decimation filter, which may further filter a channel to remove noise from the channel. Existing decimation filters, however, may have a limited configuration which prevents them from effectively filtering multiple channels. For example, existing decimation filters, when switching between multiple channels, may require different signal bandwidths or responses associated with the decimation filter settling on different channels prior to filtering the channels. Thus, noise may not be effectively filtered from channels using existing decimation filters. Such inadequacy in decimation filters may unfortunately limit opportunities to multiplex channels to gain efficiencies and cost reduction. This inadequacy may also require anti-aliasing filters that are used in conjunction with the decimation filters to be more complex, which may lead to additional costs and inefficiencies associated with filtering channels.

BRIEF DESCRIPTION OF THE INVENTION

Some or all of the above needs and/or problems may be addressed by certain embodiments of the invention. Certain embodiments may include systems and methods for filtering channels using a programmable bandwidth filter. According to one embodiment, there is disclosed a system including a switch configured to receive one or more channels and multiplex the one or more channels, a modulator, coupled to the switch, configured to modulate the one or more channels, a filter, coupled to the modulator, comprising a variable bandwidth for filtering each of the one or more channels, and at least one memory, coupled to the filter, configured to store data associated with the filtering, and a control interface configured to programmatically control the modulator and the filter based at least in part on the variable bandwidth associated with each of the one or more channels.

According to another embodiment, there is disclosed a method for determining, by a control interface, a bandwidth for a channel, adjusting, by the control interface, a first clock value in a modulator to establish a data rate for sampling the channel, and adjusting, by the control interface, a second clock value and/or filter coefficients in a decimation filter to match the first clock value.

According to a further embodiment, there is disclosed a method for receiving, at an analog multiplexing switch, a plurality of analog channels; determining, based at least in part on at least one of the plurality of analog channels, a respective bandwidth for each one of the plurality of analog channels; modulating, by a modulator coupled to the analog multiplexing switch, each one of the plurality of analog channels based at least in part on the determined bandwidth; filtering, by a variable bandwidth filter coupled to the modulator, each one of the plurality of analog channels based at least in part on the determined bandwidth; and storing, in at least one memory coupled to the variable bandwidth filter, each one of the plurality of filtered channels.

Other embodiments, systems, methods, apparatuses, aspects, and features of the invention will become apparent to those skilled in the art from the following detailed description, the accompanying drawings, and the appended claims.

BRIEF DESCRIPTION OF THE FIGURES

The detailed description is set forth with reference to the accompanying drawings, which are not necessarily drawn to scale. The use of the same reference numbers in different figures indicates similar or identical items.

Figure 1:
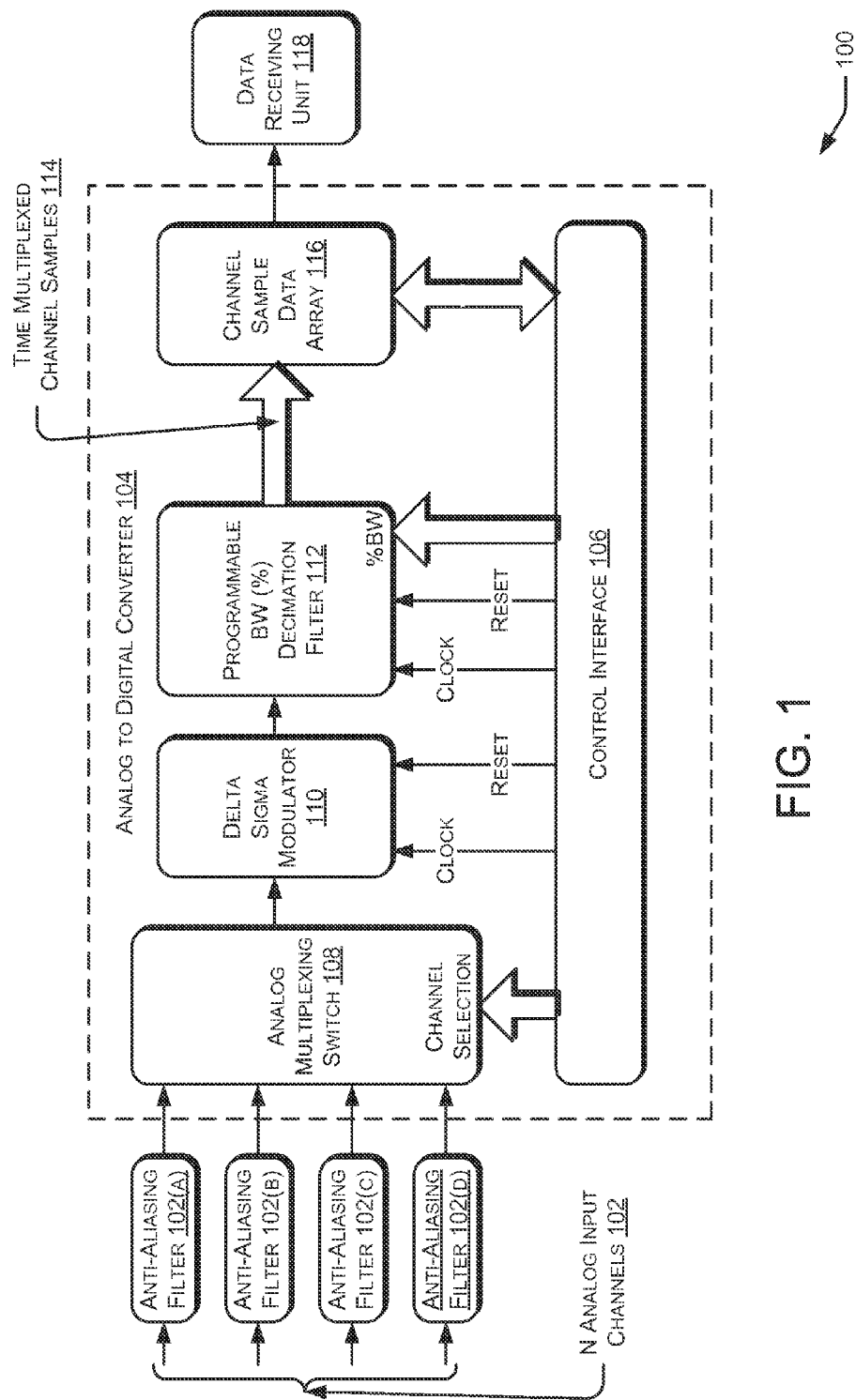
FIG. 1 is a schematic diagram of an analog-to-digital converter (ADC) that may be used to process channels received from an anti-aliasing filter, according to one embodiment.

Certain implementations will now be described more fully below with reference to the accompanying drawings, in which various implementations and/or aspects are shown. Various aspects may, however, be implemented in many different forms and should not be construed as limited to the implementations set forth herein. Like numbers refer to like elements throughout.

DETAILED DESCRIPTION OF THE INVENTION

Illustrative embodiments will now be described more fully hereinafter with reference to the accompanying drawings, in which some, but not all embodiments of the invention are shown. The invention may be embodied in many different forms and should not be construed as limited to the embodiments set forth herein; rather, these embodiments are provided so that this disclosure will satisfy applicable legal requirements.

Illustrated embodiments herein are directed to, among other things, filtering channels using a programmable bandwidth decimation filter, which may be used to filter noise from multiple channels using a bandwidth that may differ for each of the channels. Such a decimation filter may enable filtering the full noise spectrum, or at least a portion thereof, for the varying degrees of noise that may be present in each channel that may be filtered. According to certain embodiments, such filtering may be accomplished without increasing the complexity of standard, low-cost anti-aliasing filters used to filter noise from channels. According to these embodiments, analog channels may be filtered by a respective anti-aliasing filter to restrict certain frequencies to the pass band (i.e., to restrict the bandwidth of a channel to approximately satisfy the sampling theorem) so that these frequencies may be processed, e.g., sampled and filtered, by a delta sigma modulator and a programmable bandwidth decimation filter, respectively, which may be found in various types of devices, such as an ADC. A channel as described herein may refer to a logical connection which may include an information signal, such as an analog bit stream, which may be sampled and filtered as described herein in association with a channel.

A switch, such as an analog multiplexing switch, may multiplex multiple analog channels. The delta sigma modulator may encode analog channels into digital channels and output corresponding data samples, which may be filtered by a programmable bandwidth decimation filter. The programmable feature of the decimation filter may allow it to filter each channel according to a different bandwidth as needed for each channel. By adjusting the bandwidth of the filter, the frequency response of the digitized data may be adjusted such that at least approximately the full noise spectrum may be filtered from each channel. Such a bandwidth adjustment may be accomplished, in one embodiment, by altering the coefficients used to generate the frequency response for the filter. In other words, the filter rate of the decimation filter may be set to match the final sample rate of the channel. In one embodiment, the delta sigma modulator may operate at a high filter rate, and at least a portion or a reduced amount of the filter rate associated with the delta sigma modulator may be utilized for each of the channels. Adjusting the coefficients may effectively adjust a percentage bandwidth of the decimation filter, which will be discussed in greater detail below. Data associated with filtering the data samples may be stored in a memory and/or sent to a data receiving unit, where it may be used for analysis, processing, and/or other purposes.

In one embodiment, a control interface, such as an application specific integrated circuit (ASIC) or a microcontroller, may control one or more of the switch, the delta sigma modulator, the programmable bandwidth decimation filter, and the storage of the filtered channel samples. In another embodiment, one or more software programs and/or modules may implement the functions described herein.

The technical effects of certain embodiments herein may include, but are not limited to, reduced cost and complexity associated with filtering channels. For example, the programmable bandwidth filter described herein may be used in association with a minimum cost, simple anti-aliasing filter, i.e., without increasing the complexity (and reducing the accuracy) of an anti-aliasing filter to filter noise. Also, the programmable bandwidth decimation filter may also allow a delta sigma modulator to be switched across multiple channels, thereby allowing a device, such as an ADC, to handle multiplexed channels.

FIG. 1 depicts a schematic diagram of an analog-to-digital converter (ADC) 104, which may include one or more components associated with filtering channels, according to an example embodiment. Such components may include, but are not limited to, an analog multiplexing switch 108, a delta sigma modulator 110, a programmable bandwidth decimation filter 112, and a memory storing a channel sample data array 116. Although each of these components is shown in a single device in FIG. 1, the components may be included in multiple devices that may be in communication with one another to perform the features described herein. In one embodiment, analog components may be included in one device while digital components may be included in another device.

In one embodiment, the delta sigma modulator 110 may be coupled to the switch and configured to receive one or more channels and multiplex the channels when multiple channels are received. The delta sigma modulator 110 may modulate channels, or encode the analog channels into digital channels. Such encoding may include, for example, the delta sigma modulator 110 sampling an analog channel at a particular rate over a particular time interval, e.g., 8,000 digital samples per second. In some embodiments, data may be lost for channels that are not sampled during the example sampling interval described above. The delta sigma modulator 110 may switch between multiple channels to sample each of the channels. The sampling rate for each of the channels may be programmed such that it may differ for each channel that is sampled. As shown in FIG. 1, a clock value associated with the delta sigma modulator 110 may be adjusted to control the sampling rate. A reset function in the delta sigma modulator 110 may also be adjusted to clear or store sampled data values from the delta sigma modulator 110 prior to the delta sigma modulator 110 switching to another channel to prevent information associated with one channel from distorting information associated with another channel, e.g., cross talk. Whether the sampled data values are cleared or saved may depend on the amount of time between completing a sampling interval for a channel and staring another sampling interval for the same channel. If such time is relatively brief (e.g., where other channels to be sampled have faster sampling intervals than the currently sampled channel), the sampled data values may be stored and reused in the next sampling interval for the channel. If such time is relatively long, the data sample values may need to be cleared.

In one embodiment, a programmable bandwidth decimation filter 112 may be coupled to the modulator and include a variable bandwidth filter for filtering channels received by the analog multiplexing switch 108. A programmable bandwidth decimation filter 112 may include a low pass digital filter whose output sample rate is less than the filter's input sample rate. In one embodiment, the programmable bandwidth decimation filter 112 may receive input data samples from the delta sigma modulator 110 and filter those samples to remove noise or other unwanted data from the channel. Multiple types of decimation filters may exist according to various embodiments. Example programmable bandwidth decimation filters 112 may include, but are not limited to, selectable bandwidth/response infinite impulse response (IIR) filters and selectable bandwidth/response finite impulse response (FIR) filters. The bandwidth for such filters may be programmed by varying the filter coefficients associated with the filters. In other embodiments, some decimation filters may include a fixed bandwidth/response decimation filter, such as a sinc style decimation filter. Example decimation filters may include a 40% sinc style filter, a 20% IIR low pass filter (LPF), and a bandpass filter for extracting a set of tones. Various other types of fixed or selectable filters may exist in other embodiments.

To assist with filtering data samples, the programmable bandwidth decimation filter 112 may include a clock that may be matched to an adjustable clock associated with the delta sigma modulator 110. Such matching, along with programmable coefficients, may allow the programmable bandwidth decimation filter 112 to sample channels at variable rates. The percentage bandwidth filter may define the range or amount of information in the sampled data received from the delta sigma modulator 110 that may be removed. In one embodiment, the percentage bandwidth may be calculated by dividing the sampling rate by the frequency. For example, a sampling rate of approximately 8,000 samples per second used with a frequency pass band of 3,200 Hz may yield a percentage bandwidth of 40%. This value may be adjusted as necessary, e.g., to filter different information in various channels, by adjusting the clock values of the delta sigma modulator 110 and the programmable bandwidth decimation filter 112, according to certain embodiments herein. In embodiments in which the clock value is adjusted (e.g., adjusted by variable clocking), the percentage bandwidth may remain the same since the clock may be directly related to the sampling rate.

By adjusting the bandwidth associated with the programmable bandwidth decimation filter 112, e.g., by varying the coefficients, the settling times associated with switching between multiple channels to sample and filter the channels may be reduced, according to one embodiment. As a result, the programmable bandwidth decimation filter 112 may miss fewer sampled data points output by the delta sigma modulator 110 and therefore may be able to filter noise from the data samples, (e.g., at least approximately the full noise spectrum without the need for increasing complexity in the anti-aliasing filters 102a-d.

The programmable bandwidth decimation filter 112 may also be resettable such that filtered data samples may be cleared from the programmable bandwidth decimation filter 112 prior to the programmable bandwidth decimation filter 112 filtering sampled data associated with subsequent channels sampled by the delta sigma modulator 110. The values associated with filtering the sampled data, e.g., the time-multiplexed channel samples 114, may be stored in channel sample data array 116, in one embodiment. The channel sample data array 116 may be located within a memory that may be coupled to the programmable bandwidth decimation filter 112. Data stored in the array may be communicated to a data receiving unit 118 for analysis, processing, etc.

N Analog Input Channels 102 may be one or more input channels that are assigned to Anti-Aliasing Filters 102(A)-(D). An analog multiplexing switch 108 may receive one or more input channels from respective anti-aliasing filters, e.g., anti-aliasing filers 102a-d. Although four anti-aliasing filters are shown, fewer or more may be used in other embodiments. The analog multiplexing switch 108 may multiplex the one or more channels, which, as noted, may be sampled and filtered by the delta sigma modulator 110 and the programmable bandwidth decimation filter 112, respectively.

The control interface 106 may programmatically control or direct the functions performed by each of the analog multiplexing switch 108, the delta sigma modulator 110, and the programmable bandwidth decimation filter 112, as indicated by the arrows shown in FIG. 1 connecting the control interface 106 to these components. In one embodiment, such control may be based at least in part on a variable bandwidth that may be associated with each of the channels received and processed, e.g., sampled and filtered, by the components controlled by the control interface 106.

According to various embodiments, the functions performed by the control interface 106 may be implemented by an ASIC, a microcontroller, a computing device including one or more software modules, or a combination of these.

In one embodiment, the control interface 106 may control the selection of a channel (e.g., a channel among multiple channels) by the analog multiplexing switch 108. Such a selection may be initiated in response to the control interface 106 determining that sampling of a prior channel has been completed, in one embodiment. The control interface 106 may also communicate with the delta sigma modulator 110 and the programmable bandwidth decimation filter 112 to adjust a clock value, establish coefficients for the programmable bandwidth decimation filter 112, and/or reset data values that may be stored in these components. The control interface 106 may further communicate with the channel sample data array 116 to store data, such as data sampled from analog channels by the delta sigma modulator 110 and/or sampled data as filtered by the programmable bandwidth decimation filter 112, according to one configuration. Such data may be stored in at least one memory that may be coupled to the programmable bandwidth decimation filter 112. The control interface 106 may communicate with other components or devices in other embodiments.

Figure 2:
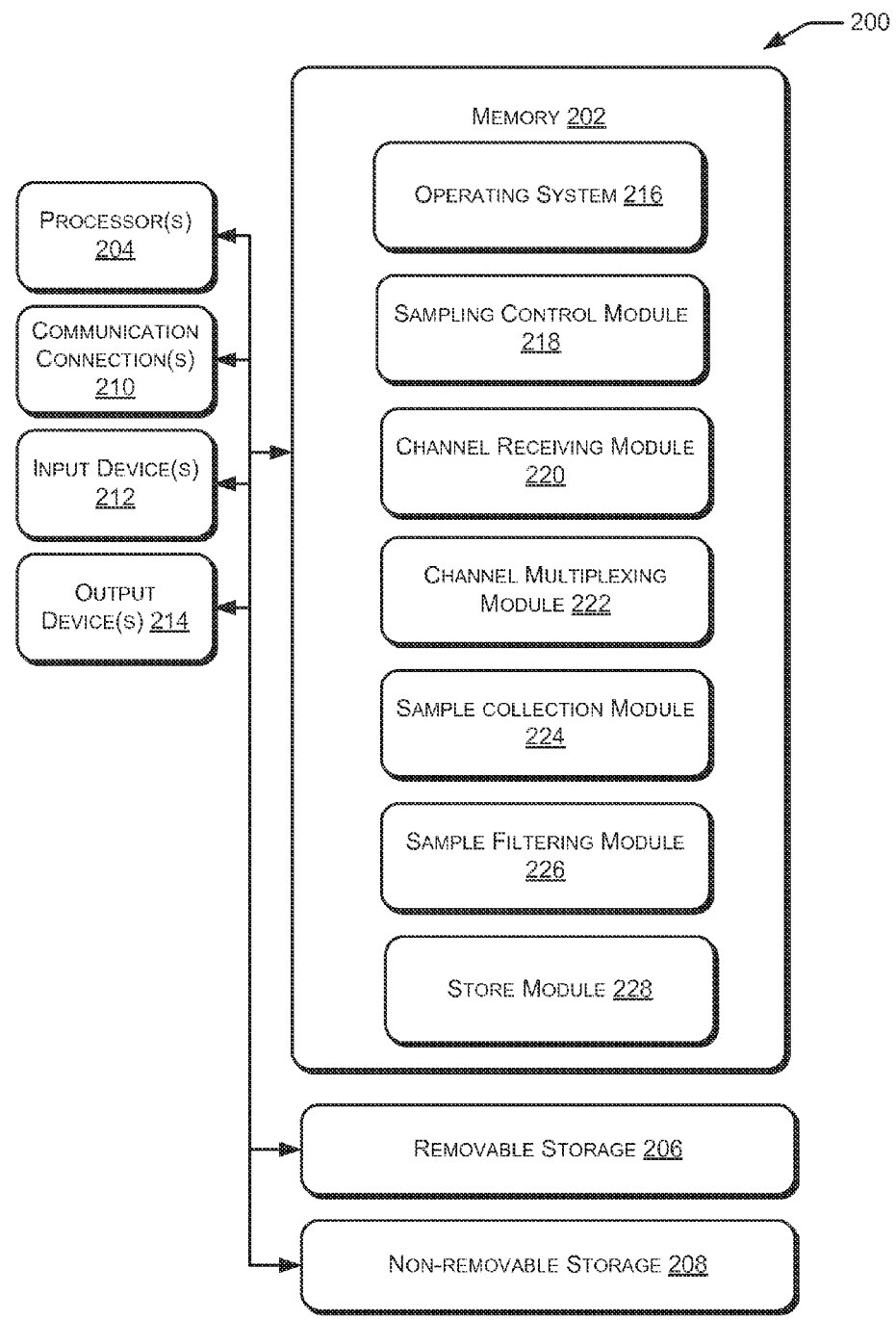
FIG. 2 is an example computing environment for processing channels, according to one embodiment.

In some embodiments, the control interface 106 may include one or more software applications and/or modules to perform the functions described herein. FIG. 2 illustrates an example computing environment 200 for implementing channel filtering using a programmable bandwidth filter, according to one embodiment. The computing environment 200 may include a computing device, which may include a processor 204 capable of communicating with a memory 202. The processor 204 may be implemented as appropriate in hardware, software, firmware, or combinations thereof. Software or firmware implementations of the processor 204 may include computer-executable or machine-executable instructions written in any suitable programming language to perform the various functions described. Examples of computing devices may include a personal computer, mainframe, web server, mobile device, or any processor-based device capable of executing instructions to perform the functions described in certain embodiments herein.

A memory 202 can store program instructions that are loadable and executable on the processor 204, as well as data generated during the execution of these programs. Depending on the configuration and type of computing environment 200, a memory 202 may be volatile (such as random access memory (RAM)) and/or non-volatile (such as read-only memory (ROM), flash memory, etc.). The computer device may also include additional removable storage 206 and/or non-removable storage 208 including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 202 may include multiple different types of memory, such as static random access memory (SRAM), dynamic random access memory (DRAM), or ROM.

In other embodiments, however, computer-readable communication media may include computer-readable instructions, program modules, or other data transmitted within a data signal, such as a carrier wave, or other transmission. As used herein, however, computer-readable storage media does not include computer-readable communication media.

The computing environment 200 may also include one or more communication connections 210. In one embodiment, the communication connections 210 can allow the computer device to send data, e.g., time-multiplexed channel samples 114, to the data receiving unit 118, which may also be a computer device that includes a memory and a processor. The connection between the computer devices and/or other devices (not shown) may be wired or wireless and may use one or more networks, according to various embodiments. The computing environment 200 can also include one or more input devices 212, such as a keyboard, mouse, pen, voice input device, and touch input device. It may also include one or more output devices 214, such as a display, printer, and speakers.

Turning to the contents of the memory 202 in detail, the memory 202 may include, but is not limited to, an operating system 216 and one or more application programs or services for implementing the features and aspects disclosed herein, including a sampling control module 218, a channel receiving module 220, a channel multiplexing module 222, a sample collection module 224, a sample filtering module 226, and a sample store module 228.

The sampling control module 218 may perform management functions associated with programmatically filtering channels. Such functions may include, but are not limited to, initializing a modulator, e.g., the delta sigma modulator 110, and a filter, e.g., the programmable bandwidth decimation filter 112. In one embodiment, such initialization may include adjusting the respective clocks in the modulator and the coefficients in the decimation filter to, for example, obtain a desired sampling rate and percentage bandwidth, respectively. The sampling control module 218 may also reset components, e.g., the delta sigma modulator 110 and the programmable bandwidth decimation filter 112, to clear previous sampling and filtering results, respectively, from these components. In one embodiment, each time a channel is sampled, the delta sigma modulator 110 may accumulate the sampled data. The store module 228 may store such results in a memory (e.g., memory 202), and the sampling control module 218 may initiate a reset of the delta sigma modulator 110 to clear the sampled data results, e.g., once the sampled data has been stored in a memory. Similarly, each time sampled data is filtered, the programmable bandwidth decimation filter 112 may accumulate results, which may be stored in a memory by the store module 228. The sampling control module 218 may also initiate a reset of the programmable bandwidth decimation filter 112 to clear the filtered data results, e.g., once the filtered data has been stored in a memory. In addition to storing the data results in a memory, the results may also be stored in the removable storage 206 and/or the non-removable storage 208.

The sampling control module 218 may also instruct a switch, e.g., the analog multiplexing switch 108, to select a channel to be processed, e.g., sampled and filtered as described herein. In one embodiment, when multiple channels exist, the sampling control module 218 may instruct the switch to select a channel upon detecting that processing for a previous channel has been completed. Such completion may be determined by the sampling control module 218 monitoring a time interval or duration for processing a channel. When the duration has been reached, the sampling control module 218 may instruct the switch to select the next channel in the sequence of channels to be processed, according to one example. Such a duration, when reached, may also trigger the sampling control module 218 to request the store module 228 to store results from sampling and filtering a channel as described above. Techniques other than time intervals or durations may be used to determine when processing for a channel has been completed, in other embodiments.

The channel receiving module 220 may receive one or more channels, e.g., analog channels, which may be multiplexed by the channel multiplexing module 222. The sample collection module 224 may sample channels as described above in association with the delta sigma modulator 110, and the sampled channels may be filtered by the sample filtering module 226 as described above in association with the programmable bandwidth decimation filter 112.

While the embodiment in FIG. 2 describes a computer device with a memory 202 including various modules, one will recognize that certain functionality associated with the computer device can be distributed to any number and combination of computer or processor-based devices in accordance with other embodiments. Various instructions, methods, and techniques described herein may be considered in the general context of computer-executable instructions, such as program modules, executed by one or more computers or other devices. Generally, program modules include routines, programs, objects, components, data structures, etc., for performing particular tasks or implementing particular abstract data types. These program modules and the like may be executed as native code or may be downloaded and executed, such as in a virtual machine or other just-in-time compilation execution environments. Typically, the functionality of the program modules may be combined or distributed as desired in various embodiments. An implementation of these modules and techniques may be stored on some form of computer-readable storage media.

Figure 3:
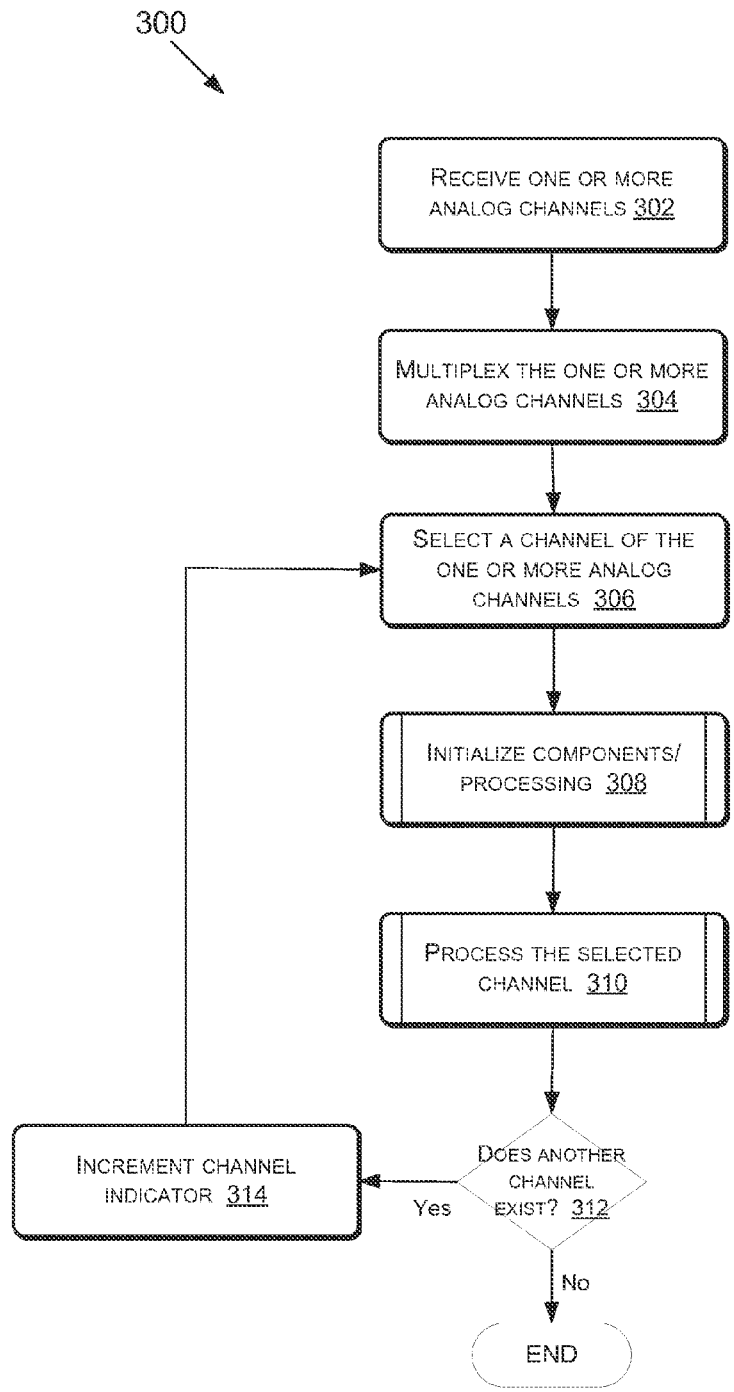
FIG. 3 is an exemplary flow diagram illustrating details of a method for using a programmable bandwidth filter to filter a channel, according to one embodiment.

FIG. 3 is an exemplary flow diagram 300 illustrating details of a method for using a programmable bandwidth filter to filter a channel, according to one embodiment. The process 300 may begin at block 302, where one or more analog channels may be received, e.g., by the analog multiplexing switch 108 or the channel receiving module 220. Information associated with the received one or more channels may also be received. Such information may include, but is not limited to, a number of channels carrying information that requires filtering, a specified data rate for each channel to use when sampling the channels, and a required amount of information, e.g., samples, coming into the filter, e.g., the programmable bandwidth decimation filter 112 or the sample filtering module 226.

At block 304, if more than one analog channel has been received, the analog channels may be multiplexed, e.g., by the analog multiplexing switch 108 or the channel multiplexing module 222. If more than one channel has been identified, at block 306, one of the channels may be selected for processing. Components or software processes used to perform the processing may be initialized at block 308 (as will be discussed in greater detail below is association with FIG. 4). The selected channel may be processed at block 310 (as will be discussed in greater detail below in association with FIG. 5).

At decision block 312, a determination may be made whether another channel requires processing. As noted above, the determination may be made upon reaching the end of a time interval or duration for processing a channel. Such a time interval or duration may be included in the information received at block 302, in one embodiment. If another channel requires processing, the next channel of the received channels may be selected at block 306, and the above described processes may be repeated for the next channel, and so forth, until each received channel is sampled and filtered, according to certain embodiments herein. At block 312, if no other channel requires processing, then the method 300 may end.

Figure 4:
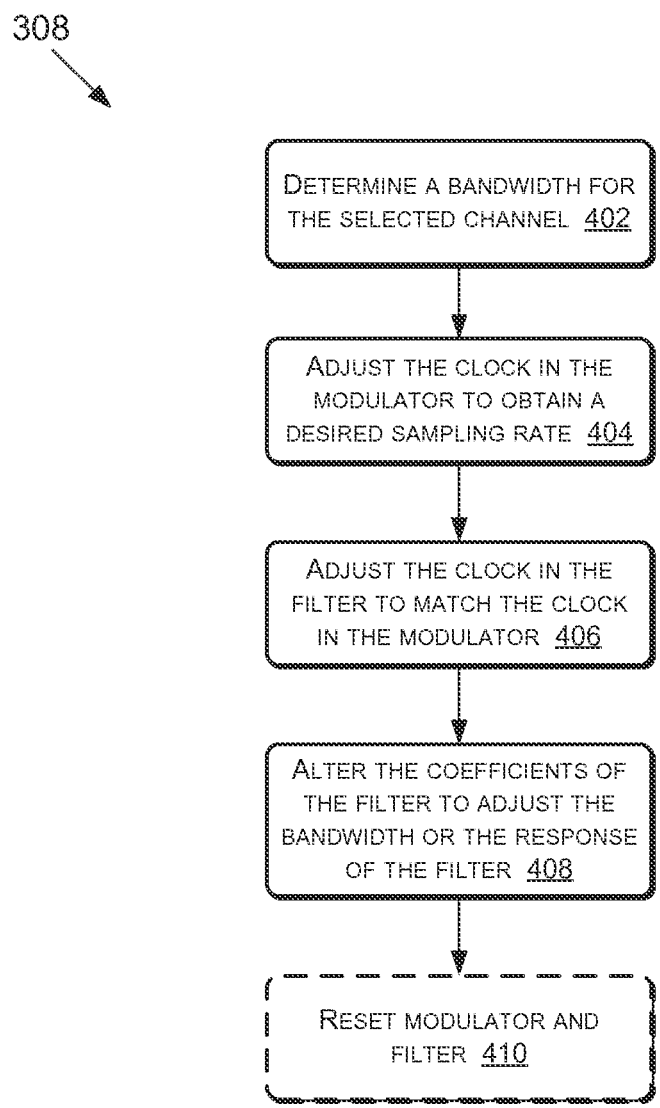
FIG. 4 is an example flow diagram illustrating details associated with initializing components prior to processing a channel, according to one embodiment.

FIG. 4 depicts an example flow diagram 308 illustrating details associated with initializing components prior to processing a channel. At block 402, the bandwidth for a selected channel may be determined. In one embodiment, such a bandwidth may be provided in the information received at block 302 of FIG. 3. Each channel may have a different bandwidth, and certain embodiments herein may include a programmable filter, e.g., programmable by coefficient loads, that may adjust to the different bandwidths to filter noise from the channels, i.e., a programmable filter. In one embodiment, the bandwidths for the filter may be set by adjusting the clock in a delta sigma modulator, e.g., the delta sigma modulator 110, to obtain a desired sampling rate (at block 404), which may also be specified in the information received at block 302. The clock in a decimation filter, e.g., the programmable bandwidth decimation filter 112, which may be coupled to the delta sigma modulator 110, may be adjusted to match the clock in the delta sigma modulator 110, at block 406. The coefficients associated with the programmable bandwidth decimation filter 112 may be altered to adjust the bandwidth or the response (e.g., frequency response) of the filter, at block 408 such that approximately the full noise spectrum may be filtered, or alternatively filtering may be accomplished without increasing the complexity of existing anti-aliasing filters used in association with a programmable bandwidth decimation filter described herein.

At block 410, the delta sigma modulator and decimation filter may be reset to clear data associated with these components processing previous channels. Such a reset may prevent results from one channel distorting results associated with another channel, e.g., cross talk. In some embodiments, such as those in which channels are being sampled according to a specified time interval or duration, a reset may not be required because the influence one channel's data may have on another channel may be negligible. According to these embodiments, data (e.g., data sampled from the channels), may be stored.

Figure 5:
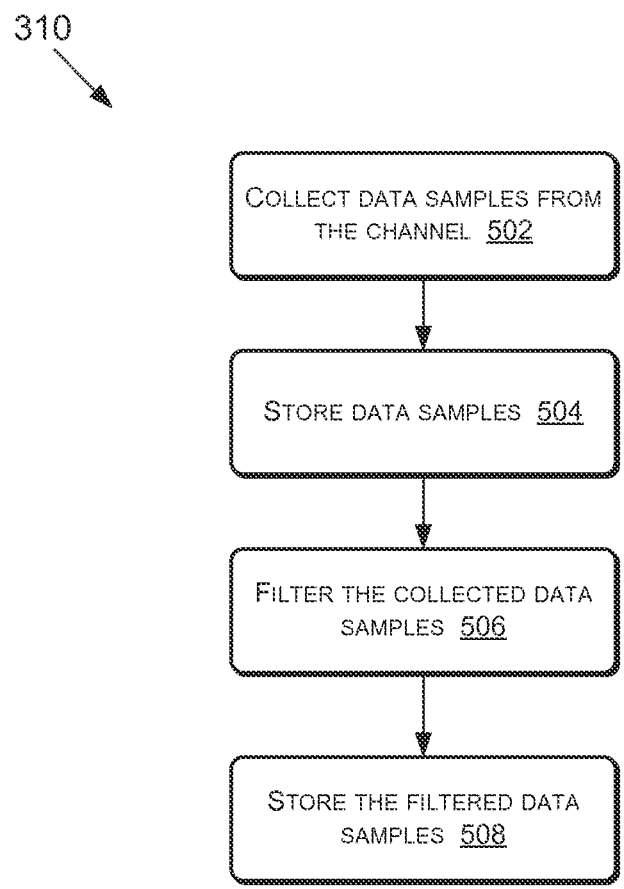
FIG. 5 is an example flow diagram illustrating details associated with processing a channel, according to one embodiment.

FIG. 5 depicts an example flow diagram 310 illustrating details associated with processing, e.g., sampling and filtering, a channel. At block 502, data samples may be collected from the channel according to a sampling rate, e.g., by the delta sigma modulator 110. Each channel may be sampled according to a different sampling rate, in one embodiment. According to one configuration, data may be sampled at a common, relatively high rate, and multiplexing may be utilized to allow a delta sigma modulator to pass information to multiple programmable bandwidth decimation filters, which in turn may decimate to the sampling rate established for each channel. Sampling the channel may include modulating the channel, or generating a digital representation of the channel, e.g., the analog channel received at block 302 of FIG. 3. As noted, the samples may be taken for an interval of time, after which a value associated with the data samples may be considered to be stable. The data samples may be stored at block 504, e.g., via the control interface 106 or the store module 228. In one embodiment, the data samples may be stored in an array, e.g., the channel sample data array 116, which may exist in a memory, e.g., a memory coupled to a decimation filter or a memory in a computing device.

The data samples may be filtered at block 506, e.g., via the programmable bandwidth decimation filter 112 or the sample filtering module 226. As noted, a programmable filter as described herein may include a bandwidth that may be programmed for each channel such that the bandwidth may vary to more effectively filter each channel. A programmable bandwidth may, in effect, reduce the settling time required for a decimation filter to begin filtering sampled channel data, thereby allowing a decimation filter to filter approximately the full spectrum of noise. The filtered data may also be stored at block 508, e.g., via the control interface 106 or the store module 228. In one embodiment, the data samples may be stored in an array, e.g., the channel sample data array 116, as time-multiplexed channel samples 114. Such time-multiplexed channel samples may not include noise or unwanted information, according to one embodiment.

In one example, a computing device can perform any, some, or all of the operations of the processes 308 (FIG. 4) and 310 (FIG. 5). The processes 308 and 310 are illustrated as logical flow diagrams, in which each operation represents a sequence of operations that can be implemented in hardware, software, or a combination thereof. In the context of software, the operations can represent computer-executable instructions stored on one or more computer-readable storage media that, when executed by one or more processors, perform the recited operations. Generally, computer-executable instructions can include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

That which is claimed:

1. A system, comprising:
   an analog multiplexing switch configured to receive a plurality of analog channels and generate therefrom, a multiplexed analog data stream;
   a modulator, coupled to the analog multiplexing switch, the modulator configured to receive the multiplexed analog data stream and generate therefrom, a multiplexed digital data stream comprising a first channel and a second channel; and
   a programmable bandwidth filter coupled to the modulator, the programmable bandwidth filter configured to at least filter the first channel of the multiplexed digital data stream according to a first bandwidth, and filter the second channel of the multiplexed digital data stream according to a second bandwidth that is different than the first bandwidth.

2. The system of claim 1, wherein the programmable bandwidth filter is configured to adjust at least one of a settling time or a frequency response when filtering at least one of the first channel or the second channel.

3. The system of claim 1, wherein the modulator comprises a delta sigma modulator, the delta sigma modulator configured to be adjusted by variable clocking.

4. The system of claim 1, wherein the programmable bandwidth filter comprises a programmable bandwidth decimation filter configured to be adjusted by a coefficient load.

5. The system of claim 1, further comprising:
   a plurality of antialiasing filters for filtering each of a respective one of the plurality of analog channels that are provided to the analog multiplexing switch.

6. The system of claim 1, wherein the programmable bandwidth filter is configured to filter the first channel using a first set of filter coefficients and the second channel using a second set of filter coefficients that is different than the first set of filter coefficients.

7. The system of claim 6, wherein the first set of filter coefficients corresponds to a first sampling rate and the second set of filter coefficients corresponds to a second sampling rate that is different than the first sampling rate.

8. The system of claim 1, further comprising:
   a control interface configured to provide a first clock value when the programmable bandwidth filter is configured to filter the first channel according to the first bandwidth and to provide a second clock value when the programmable bandwidth filter is configured to filter the second channel according to the second bandwidth.

9. The system of claim 1, further comprising:
   a memory coupled to the programmable bandwidth filter.

10. The system of claim 9, wherein the memory comprises a channel sample data array.

11. A method, comprising:
   receiving, at an analog multiplexing switch, a plurality of analog channels;
   determining a respective bandwidth for each one of the plurality of analog channels;
   modulating, by a modulator coupled to the analog multiplexing switch, each one of the plurality of analog channels based at least in part on the determined bandwidth; and
   filtering, by a variable bandwidth filter coupled to the modulator, a first modulated channel according to a first bandwidth and a second modulated channel according to a second bandwidth that is different than the first bandwidth.

12. The method of claim 11, wherein the bandwidth associated with each one of the plurality of analog channels is received by at least one of the modulator or the filter, from a control interface.

* * * * *